(12) United States Patent
Kempen et al.

(10) Patent No.: US 8,685,632 B2
(45) Date of Patent: Apr. 1, 2014

(54) RADIATION SOURCE, LITHOGRAPHIC APPARATUS AND DEVICE MANUFACTURING METHOD

(75) Inventors: Antonius Theodorus Wilhelmus Kempen, 's-Hertogenbosch (NL); Vadim Yevgenyevich Banine, Deurne (NL); Vladimir Vitalevich Ivanov, Moscow (RU); Erik Roelof Loopstra, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 71 days.

(21) Appl. No.: 13/058,788

(22) PCT Filed: Jul. 13, 2009

(86) PCT No.: PCT/EP2009/058898
§ 371 (c)(1),
(2), (4) Date: Feb. 11, 2011

(87) PCT Pub. No.: WO2010/018039
PCT Pub. Date: Feb. 18, 2010

(65) Prior Publication Data
US 2011/0143288 A1 Jun. 16, 2011

Related U.S. Application Data

(60) Provisional application No. 61/136,130, filed on Aug. 14, 2008, provisional application No. 61/136,129, filed on Aug. 14, 2008, provisional application No. 61/193,373, filed on Nov. 21, 2008.

(51) Int. Cl.
*G03F 7/20* (2006.01)
*G21K 1/00* (2006.01)

(52) U.S. Cl.
CPC ............... *G03F 7/2008* (2013.01); *G21K 1/00* (2013.01)
USPC ............ 430/325; 355/67; 355/30; 250/492.1; 250/493.1

(58) Field of Classification Search
None
See application file for complete search history.

(56) References Cited

U.S. PATENT DOCUMENTS

| 7,345,739 B2 | 3/2008 | Hendriks et al. |
| 7,473,908 B2 | 1/2009 | Van Herpen et al. |

(Continued)

FOREIGN PATENT DOCUMENTS

| CN | 1527139 | 9/2004 |
| CN | 1696833 | 11/2005 |

(Continued)

OTHER PUBLICATIONS

Niimi et al., "development of high repetition rate and high power DPP EUV source"., Powerpoint presentation form 2005 Inter. Sympos. on EUVL., 23 pages, (Nov. 2005).*

(Continued)

*Primary Examiner* — Martin Angebranndt
(74) *Attorney, Agent, or Firm* — Pillsbury Winthrop Shaw Pittman LLP

(57) ABSTRACT

A lithographic apparatus includes a source configured to generate a radiation beam comprising desired radiation and undesired radiation using a plasma, an illumination system configured to condition the radiation beam and to receive hydrogen gas during operation of the lithographic apparatus, and a support structure constructed to hold a patterning device. The patterning device is capable of imparting the radiation beam with a pattern in its cross-section to form a patterned radiation beam. A substrate table is constructed to hold a substrate, and a projection system is configured to project the patterned radiation beam onto a target portion of the substrate. The lithographic apparatus is configured such that the radiation beam on entering the projection system includes at least 50% of the undesired radiation that is generated by the plasma and includes wavelengths of radiation that interact with the hydrogen gas to generate hydrogen radicals.

5 Claims, 2 Drawing Sheets

(56) References Cited

U.S. PATENT DOCUMENTS

| | | | |
|---|---|---|---|
| 7,518,128 B2 * | 4/2009 | Van Herpen et al. | 250/492.2 |
| 8,094,288 B2 | 1/2012 | Banine et al. | |
| 8,279,397 B2 | 10/2012 | Ehm et al. | |
| 2005/0057734 A1 | 3/2005 | Johannes et al. | |
| 2005/0110965 A1 | 5/2005 | Hendriks et al. | |
| 2005/0254029 A1 | 11/2005 | Banine et al. | |
| 2006/0146413 A1 * | 7/2006 | Klunder et al. | 359/634 |
| 2008/0001101 A1 | 1/2008 | Van Herpen et al. | |
| 2008/0011967 A1 | 1/2008 | Van Herpen et al. | |
| 2009/0314931 A1 | 12/2009 | Ehm et al. | |
| 2010/0328639 A1 * | 12/2010 | Jak et al. | 355/71 |

FOREIGN PATENT DOCUMENTS

| | | |
|---|---|---|
| JP | 2008-507840 | 3/2008 |
| JP | 2009-543332 | 12/2009 |
| JP | 2009-544148 | 12/2009 |
| JP | 2010-510679 | 4/2010 |
| WO | 2006/011105 A | 2/2006 |
| WO | 2008/002134 A | 1/2008 |
| WO | 2008/061690 | 5/2008 |

OTHER PUBLICATIONS

International Preliminary Report on Patentability for PCT International Patent Application No. PCT/EP2009/058898, mailed Feb. 15, 2011.

International Search Report for PCT International Patent Application No. PCT/EP2009/058898, mailed Oct. 6, 2009.

Chinese Office Action dated Oct. 22, 2012 in corresponding Chinese Patent Application No. 200980131416.4.

Japanese Office Action mailed Mar. 28, 2013 in corresponding Japanese Patent Application No. 2011-522453.

* cited by examiner

RADIATION SOURCE, LITHOGRAPHIC APPARATUS AND DEVICE MANUFACTURING METHOD

CROSS-REFERENCE TO RELATED APPLICATIONS

This application is the U.S. National Phase application of PCT/EP2009/058898, filed Jul. 13, 2009, which claims the benefit of priority from U.S. Provisional Application Nos. 61/136,129, filed Aug. 14, 2008, 61/136,130, filed Aug. 14, 2008, and 61/193,373, filed Nov. 21, 2008, the entire contents of all of which are incorporated herein by reference.

FIELD

The present invention relates to a lithographic apparatus and a method for producing extreme ultraviolet radiation.

BACKGROUND

A lithographic apparatus is a machine that applies a desired pattern onto a substrate, usually onto a target portion of the substrate. A lithographic apparatus can be used, for example, in the manufacture of integrated circuits (ICs). In that example, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction.

A theoretical estimate of the limits of pattern printing can be given by the Rayleigh criterion for resolution:

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from the Rayleigh criterion that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength, and thus reduce the critical dimension, it has been proposed to use an extreme ultraviolet (EUV) radiation source. EUV radiation sources are configured to output a radiation wavelength of about 13 nm. Thus, EUV radiation sources may constitute a significant step toward achieving small features printing. Possible sources of EUV radiation include, for example, laser-produced plasma sources, discharge plasma sources, or synchrotron radiation from electron storage rings. When using a plasma source, contamination particles are created as a by-product of the plasma generation. Generally, such contamination particles are undesired because they adhere for example to reflective surfaces of the lithographic apparatus. Build up of contamination particles on reflective surfaces of the lithographic apparatus reduces the reflectivity of those surfaces, and consequently reduces the achievable throughput of the lithographic apparatus.

It is desirable to reduce the accumulation of contamination particles on reflective surfaces of the lithographic apparatus.

SUMMARY

According to an aspect of the invention, there is provided a lithographic apparatus includes a source configured to generate a radiation beam comprising desired radiation and undesired radiation using a plasma, an illumination system configured to condition the radiation beam and to receive hydrogen gas during operation of the lithographic apparatus, and a support structure constructed to hold a patterning device. The patterning device is capable of imparting the radiation beam with a pattern in its cross-section to form a patterned radiation beam. A substrate table is constructed to hold a substrate, and a projection system is configured to project the patterned radiation beam onto a target portion of the substrate. The lithographic apparatus is configured such that the radiation beam on entering the projection system includes at least 50% of the undesired radiation that is generated by the plasma and includes wavelengths of radiation that interact with the hydrogen gas to generate hydrogen radicals.

According to an aspect of the invention, there is provided a device manufacturing method a device manufacturing method that includes generating a radiation beam comprising desirable radiation and undesirable radiation using a plasma, directing the radiation beam through an illumination system which conditions the radiation beam, directing the radiation beam onto a patterning device which imparts the radiation beam with a pattern in its cross-section to form a patterned radiation beam, projecting the patterned radiation beam onto a target portion of a substrate using a projection system, providing hydrogen gas to the illumination system and/or the projection system, and generating hydrogen radicals from the hydrogen gas with the undesirable radiation that is generated by the plasma. The radiation beam on entering the illumination system and/or the projection system includes at least 50% of the undesirable radiation that is used to generate the hydrogen radicals.

According to an aspect of the invention, there is provided a lithographic apparatus that includes a source configured to generate a radiation beam using a plasma, an illumination system configured to condition the radiation beam, and a support structure constructed to hold a patterning device. The patterning device is capable of imparting the radiation beam with a pattern in its cross-section to form a patterned radiation beam. A substrate table is constructed to hold a substrate, and a projection system is configured to project the patterned radiation beam onto a target portion of the substrate. One or more of the source, illumination system and projection system is configured to receive hydrogen gas and an inert gas during operation of the lithographic apparatus. The radiation beam interacts with the inert gas to generate atomic hydrogen to increase an amount of cleaning provided by the hydrogen gas.

According to an aspect of the invention, there is provided a device manufacturing method that includes generating a radiation beam using a plasma which forms part of a source, directing the radiation beam through an illumination system which conditions the radiation beam, directing the radiation beam onto a patterning device which imparts the radiation beam with a pattern in its cross-section to form a patterned radiation beam, projecting the patterned radiation beam onto a target portion of a substrate using a projection system, providing a mixture of hydrogen gas and an inert gas to one or more of the source, illumination system and projection system, and generating atomic hydrogen with the radiation beam and the inert gas to increase an amount of cleaning provided by the hydrogen gas.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
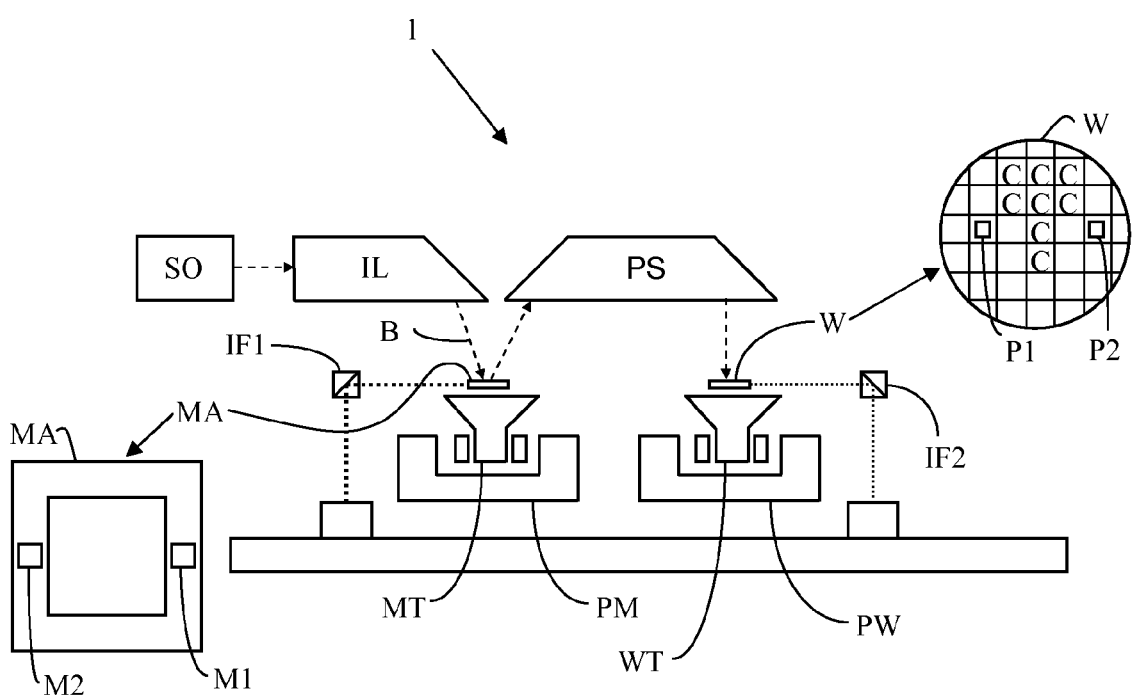
FIG. 1 schematically depicts a lithographic apparatus according to an embodiment of the invention.

FIG. 1 schematically depicts a lithographic apparatus 1 according to an embodiment of the invention. The apparatus comprises: an illumination system (illumination system) IL configured to condition a radiation beam B of radiation. The apparatus also includes a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used. Any use of the term "projection lens" herein may be considered as synonymous with the more general term "projection system".

As here depicted, the apparatus may be of a reflective type (e.g. employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illumination system IL receives a radiation beam from a radiation source SO. The source SO and the illumination system IL, together with the beam delivery system if required, may be referred to as a radiation system.

The illumination system IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator and a condenser. The illumination system may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
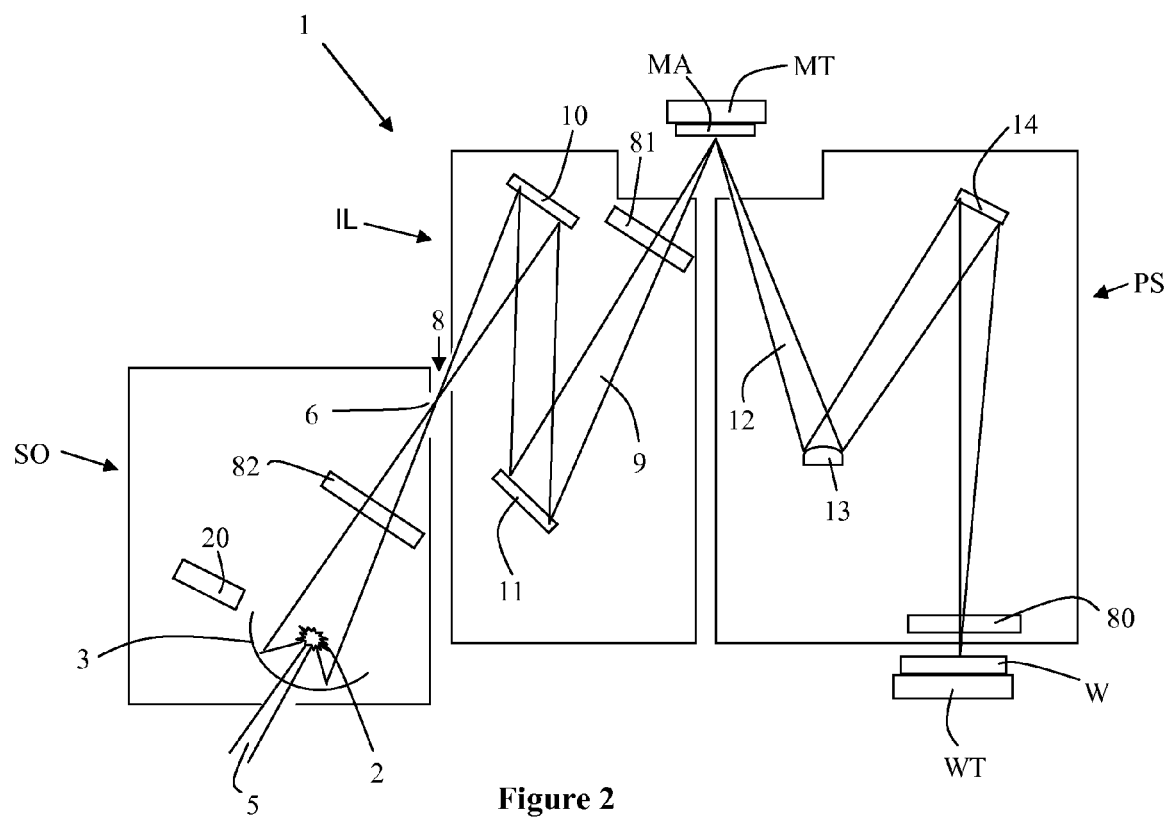
FIG. 2 schematically depicts in more detail the lithographic apparatus according to the embodiment of the invention.

FIG. 2 shows the apparatus of FIG. 1 in more detail, including the source SO, the illumination system IL, and the projection system PS. The source SO generates EUV radiation, as well as non-EUV radiation such as, for example, ultraviolet (UV) radiation and deep ultraviolet (DUV) radiation, and infrared (IR) radiation from a plasma 2. The plasma 2 is created by directing a laser beam 5 onto droplets of a suitable material such as Sn or Gd which are generated by a droplet generator 20. The laser beam 5 causes the droplets to be vaporized, thereby generating the plasma 2. A source of this type may be referred to as a laser produced plasma (LPP) source.

Radiation emitted by the plasma 2 is collected by a collector 3, and is brought to an intermediate focus 8. The intermediate focus 8 acts as a virtual source point 8 at an aperture in the source SO. From the source SO, a beam of radiation 9 is reflected in the illumination system IL via first and second normal incidence reflectors 10, 11 onto a patterning device MA (e.g. a mask) positioned on support structure MT. A patterned beam 12 is formed which is imaged in the projection system PS via first and second reflective elements 13, 14 onto a substrate W held on a substrate table WT. More elements than shown may generally be present in the illumination system IL and projection system PS.

In an alternative configuration (not illustrated) the EUV radiation may be generated by causing a partially ionized plasma of an electrical discharge to collapse onto an optical axis. This source may be referred to as a discharge produced plasma (DPP) source. Partial pressures of for example 10 Pa of Xe, Li, Sn vapor or any other suitable gas or vapor may be used to generate the EUV radiation emitting plasma.

Although the collector 3 shown in FIG. 2 is a single curved mirror, the collector may take other forms. For example, the collector may be a Schwarzschild collector having two radiation collecting surfaces. In an alternative example, the collector may be a grazing incidence collector which comprises a plurality of substantially cylindrical reflectors nested within one another. The grazing incidence collector may be suited for use in a DPP source.

In general, a collector may be configured to collect radiation generated by a plasma 2, and to focus collected radiation to form a radiation beam. The radiation beam may pass through an aperture 6 between a source SO and an illumination system IL (shown schematically as separate apertures in the source SO and illumination system IL for ease of illustration). The aperture 6 may be a circular aperture, or have another shape (for example elliptical, square, etc). The aperture 6 may be small, for example having a diameter less than about 10 cm, preferably less than 1 cm, (measured in a direction transverse to an optical axis of the lithographic apparatus.

When using a laser produced plasma (LPP) source or discharge produced plasma (DPP) source, contamination may be produced in the form of fast ions and/or neutral particles (for example Sn (tin)). Such contamination may build up on the reflective surface(s) of the collector 3, causing the collector to lose reflectivity and thereby reducing the efficiency of the collector. Contamination may also cause other reflective components of the lithographic apparatus (for example mirrors 10, 11, 13, 14 or patterning device MA) to lose reflectivity over time. The throughput of the lithographic apparatus is dependent upon the intensity of EUV radiation which is incident on a substrate being exposed. Any reduction of reflectivity which arises due to the build up of contamination on the collector or other reflective surfaces of the lithographic apparatus will reduce the throughput of the lithographic apparatus.

In an embodiment of the invention, contamination of reflective surfaces of the lithographic apparatus may be removed using hydrogen radicals. The hydrogen radicals remove contamination from the reflective surfaces by reacting with the contamination. For example, hydrogen radicals can react with tin (Sn) contamination to form gaseous $SnH_4$ that may then be pumped out of the lithographic apparatus. In another example, hydrogen radicals can react with carbon (C) contamination to form hydrocarbons which may then be pumped out of the lithographic apparatus.

In addition to removing contamination, the hydrogen radicals may also inhibit the depositing of contamination on the reflective surfaces in the first place.

The hydrogen radicals may be generated via dissociation of hydrogen molecules. This dissociation may arise due to radiation emitted by the plasma 2 being incident upon the hydrogen molecules and causing the hydrogen molecules to atomize and form hydrogen radicals.

The source SO may contain an atmosphere of hydrogen (i.e. hydrogen gas) during use (i.e. during operation of the lithographic apparatus). The pressure of hydrogen in the source SO may depend upon whether the source is an LPP source or a DPP source. In an LPP source, the pressure of hydrogen may for example be tens of Pascals, around 100 Pa, or several hundred Pascals. In a DPP source, the pressure of hydrogen may for example be in the range 2-5 Pa, and may for example be 3 Pa. The pressure in the source is sometimes referred to as the base pressure.

In some instances, the plasma may be generated in a chamber (not illustrated) within the source SO. The chamber, which is referred to here as the plasma chamber, may for example be present in an LPP source. The pressure of hydrogen gas in the chamber may be higher than the pressure of hydrogen gas in the remainder of the source SO.

The radiation emitted by the plasma 2 causes dissociation of hydrogen molecules of the hydrogen gas in the source SO (including in the plasma chamber where it is present), thereby generating hydrogen radicals. The hydrogen radicals remove contamination from reflective surfaces in the source, and may also inhibit the depositing of contamination on the reflective surfaces.

Using radiation emitted by the plasma 2 to generate hydrogen radicals may have several advantages. For example, it is not necessary to use hardware such as a dedicated hydrogen radical generator to generate the hydrogen radicals. In addition to being expensive, dedicated hydrogen radical generators generally work by dissociating hydrogen using tungsten filaments. The tungsten filaments could lead to unwanted tungsten contamination in the lithographic apparatus. This tungsten contamination risk is avoided since a dedicated hydrogen radical generator is not required by embodiments of the present invention.

An additional advantage of using radiation emitted by the plasma 2 to generate hydrogen radicals is that it allows cleaning of reflective surfaces of the lithographic apparatus to be carried out during operation of the lithographic apparatus (i.e. simultaneously with exposure of substrates by the lithographic apparatus).

A further advantage which arises from reducing the build up of contamination on reflective surfaces is that the extent to which the reflective surfaces are heated by radiation absorption is reduced. This is because the reflectivity of the reflective surfaces remains higher than would otherwise be the case, leading to less radiation being absorbed.

In a conventional lithographic apparatus, a filter is typically used to filter out wavelengths of radiation which are not required for projection of a pattern from a patterning device MA onto a substrate W, which may be called "undesired radiation." For example, if the lithographic apparatus is configured to use EUV radiation for projection of a pattern onto a substrate, the filter may for example be a spectral purity filter which is arranged to transmit desired radiation having a wavelength of, for example 13.5 nm which is within the EUV range of wavelengths, while blocking undesired radiation of other wavelengths. The undesired radiation may include the UV, DUV, and IR radiation that is also generated by the plasma in the source. It is conventional to provide a spectral purity filter adjacent to the plasma 2 (for example between the collector 3 and the aperture 6 of the source SO), in order to limit the amount of radiation which passes into the illumination system IL and projection system PS of the lithographic apparatus. The term 'spectral purity filter' may be considered to mean a filter which selects a specific desired portion of the electromagnetic spectrum (for example 13.5 nm, 6.7 nm or 6.8 nm).

Dissociation of hydrogen into hydrogen radicals may be a function of the intensity of the radiation generated by the plasma and/or the wavelength of the radiation generated by the plasma. For these reasons, in an embodiment of the invention a spectral purity filter is located in the illumination system IL or the projection system PS instead of being located adjacent to the plasma 2.

In an embodiment of the invention, the spectral purity filter 80 is positioned at an end of the projection system PS which receives the radiation beam last. Since the spectral purity filter 80 is located at the end of the projection system PS which receives the radiation beam last, in addition to passing through the source SO, the unfiltered radiation emitted by the plasma 2 passes through the illumination system IL and projection system PS. This unfiltered radiation may dissociate hydrogen present in the source SO, illumination system IL and projection system PS, thereby generating hydrogen radicals which clean optical surfaces of the collector 3, illumination system mirrors 10, 11 and projection system mirrors 13, 14. In an embodiment, at least 50% of the undesired radiation that is generated by the source SO and may be used to generate hydrogen radicals passes through the illumination system IL and projection system PS. In an embodiment, at least 70% of the undesired radiation that is generated by the source SO passes through the illumination system IL and projection system PS. In an embodiment, at least 90% of the undesired radiation that is generated by the source SO passes through the illumination system IL and projection system PS.

The intensity of the unfiltered radiation will reduce gradually as it passes through the illumination optics unit and projection system, since a loss is incurred each time the radiation is reflected by the reflective surfaces 10, 11, 13, 14. However, the unfiltered radiation is more intense than would have been the case if it had been filtered by a spectral purity filter prior to entering the illumination system IL and projection system PS.

The intensity of radiation that impinges on the spectral purity filter 80 is less than the intensity of radiation that would have impinged on the spectral purity filter if it was located adjacent to the plasma 2. As a result of this reduced intensity, the lifetime of the spectral purity filter may be significantly increased.

In an embodiment of the invention, a spectral purity filter 81 is positioned at an end of the illumination system IL which receives the radiation beam last. Since the spectral purity filter 81 is located at the end of the illumination system IL, which receives the radiation beam last, in addition to passing through the source SO, the unfiltered radiation emitted by the plasma 2 passes through the illumination system IL. This unfiltered radiation may dissociate hydrogen present in the source SO and the illumination system IL, thereby generating hydrogen radicals which clean optical surfaces of the collector 3, and the illumination system mirrors 10, 11. Providing the spectral purity filter in the illumination system IL ensures that the radiation beam is filtered before it is incident upon the patterning device MA. This may be desirable for example if the unfiltered radiation beam would be expected to transfer too much heat to the patterning device.

The spectral purity filter 81 may for example be provided in the illumination system instead of or as well as the spectral purity filter 80 in the projection system.

The illumination system spectral purity filter 81 and the projection system spectral purity filter 80 may be provided at any suitable locations in the illumination system an the projection system. The positions shown in FIG. 2 are merely examples.

The spectral purity filter may be a transmissive filter 80, 81 (as shown in FIG. 2) or may be a reflective filter, such as for example a blazed grating. Where the spectral purity filter is a transmissive filter, it may for example have a transmission of at least 40%, at least 60%, at least 80%, or at least 90% for desired radiation such as EUV radiation (e.g. at 13.5 nm). Where the spectral purity filter is a reflective filter, it may for example have a reflectance of at least 40%, at least 60%, at least 80%, or at least 90% for desired radiation such as EUV radiation (e.g. at 13.5 nm). The spectral purity filter's transmission ratio of EUV radiation to DUV radiation may be 100, 1000 or even up to $10^5$.

The spectral purity filter 80, 81 may be configured to filter out undesired radiation. Undesired radiation may be defined as radiation having wavelengths other than the wavelength which is used to project a pattern onto a substrate (e.g. wavelengths other than 13.5 nm). The undesired radiation, which may be reflected or absorbed by the spectral purity filter, may have wavelengths which are longer or shorter than the desired radiation. In an embodiment of the invention, undesired radiation and desired radiation are both used to dissociate hydrogen into hydrogen radicals. This may happen in the source SO, illumination system IL or projection system PS of the lithographic apparatus. The undesired radiation may include deep ultraviolet (DUV) radiation and ultraviolet (UV) radiation.

The spectral purity filter 80, 81 may include a multi-layered structure of alternating layers. The multi-layered structure of the spectral purity filter may have for example 2-200 alternating layers, 10-100 alternating layers, or 20-50 alternating layers. The alternating layers may for example have a thickness of 0.2 to 100 nm, 0.2 to 20 nm, or 0.5 to 5 nm. Each of the alternating layers may form continuous layers of substantially constant thickness. The total thickness of the multi-layered structure of alternating layers may range from 10 to 700 nm, and may range from 100 to 200 nm.

The multi-layered structure of alternating layers of the spectral purity filter 80, 81 may be formed from any suitable number of different alternating layers. For example, there may be two different layers which alternate with one another. Alternatively, there may be three different layers which alternate with one another.

The alternating layers forming the multi-layered structure of the spectral purity filter 80 may be formed from a combination of any of the following: Zr and Si layers; Zr and $B_4C$ layers; Mo and Si layers; Cr and Sc layers; Mo and C layers; and Nb and Si layers. The multi-layered structure of alternating layers may be formed by depositing alternating layers of, for example, Zr and Si, using any suitable technique such as magnetron sputtering, epitaxy, ion sputtering and e-beam evaporation with or without ion polishing. Additional information regarding the spectral purity filter may be gleaned from co-pending U.S. Pat. No. 7,372,623 issued on May 13, 2008, the content of which is incorporated herein in its entirety by reference.

In an embodiment of the invention, more than one radiation filter may be provided in the lithographic apparatus. For example, a filter 82 which blocks infrared radiation may be provided in the source SO. Infrared radiation may provide little or no assistance in the generation of hydrogen radicals via dissociation of hydrogen molecules. Since the infrared radiation would contribute to unwanted heating of mirrors in the illumination system IL and projection system PS, the infrared filter 82 is used to filter out the infrared radiation before it enters illumination system IL and projection system PS. The infrared filter 82 may for example comprise a metal grid, having a period which is less than the wavelength of radiation to be removed.

In general, a low-pass filter which blocks wavelengths longer than a desired wavelength may be provided adjacent to the source SO, in the source SO, or at any other suitable location in the lithographic apparatus.

In general, one or more filters which filter out at least some wavelengths which are not desired for use in lithographic projection of a pattern onto a substrate, and which do not assist in the generation of hydrogen radicals, may be provided adjacent to the source SO, in the source SO, or at any other suitable location. The one or more filters may be provided such that the radiation beam is filtered by the one or more filters before it is incident upon a reflector of the illumination system IL. The infrared filter 82 described above may be considered to be an example of this kind of filter.

In general, one or more filters which filter out wavelengths that assist in the generation of hydrogen radicals but which are not desired for use in lithographic projection of a pattern onto a substrate may be provided in the projection system PS (for example adjacent to the substrate table WT), in the illumination system IL, or in any other suitable location. The spectral purity filters 80, 81 described above may be considered to be examples of this kind of filter.

In addition to providing filtering of radiation, the filter may seal the projection system PS adjacent to the substrate stage WT. The filter may be located after the projection system but before the location where a substrate W will be provided in use. For example, the filter may be provided adjacent to a dynamic gas lock which is configured to blow gas towards the substrate. Where this is done, the filter may be located such that gas emitted by the dynamic gas lock is reflected from the surface of the filter towards the substrate, thereby improving the flow of gas towards the substrate.

The pressure of hydrogen may be substantially the same in the source SO, and/or the illumination system IL and/or the projection system PS. Alternatively, the pressure may be different in each of these locations. The pressure of hydrogen at a given location may for example be set based on the type and degree of contamination that is expected to arise on the reflective surfaces in that location. For example, more contamination may be present in the source SO (for example at the collector 3), and the contaminant may for example be tin (Sn). Whereas, in the illumination system IL and/or the projection system PS less contamination may be present, and the contaminant may for example be carbon (C). The hydrogen pressure may therefore be higher in the source SO than in the illumination system IL. For the same reason, the hydrogen pressure may be higher in the illumination system IL than in the projection system PS.

In an embodiment, the pressure range of hydrogen in the source SO is in the range 2-200 Pa, and may be around 100 Pa. In an embodiment, the pressure range of hydrogen in the illumination system IL and the projection system PS is in the range 0.3-20 Pa, and may be around 3 Pa.

A single gas supply system may be used to provide hydrogen to different parts of the lithographic apparatus (e.g. to the source SO, the illumination system IL and the projection system PS). Alternatively, each separate part may include a dedicated gas supply system that is adapted to provide hydrogen.

In an embodiment, a radiation source may be provided (in addition to the plasma 2), the radiation source being arranged to provide DUV and/or UV radiation in the lithographic apparatus, and thereby assist in the generation of hydrogen radicals from the hydrogen gas. For example, an additional radiation source (not shown) which emits DUV and/or UV radiation may be provided in the projection system PS. An additional radiation source which emits DUV and/or UV radiation may be provided in the illumination system IL. Where this is done, the spectral purity filter may be positioned between the additional radiation source and the substrate table WT, such that radiation from the additional radiation source is blocked from being incident on a substrate W during operation of the lithographic apparatus.

In an embodiment of the invention, argon gas may be introduced into the lithographic apparatus along with the hydrogen gas. Since argon is inert, it does not directly assist in removing contamination from reflective surfaces of the lithographic apparatus. However, the argon assists in the generation of atomic hydrogen. As a result, additional atomic hydrogen may be generated, and a corresponding increase of the cleaning effect may be seen.

The argon gas may receive energy from the radiation beam, which energy is then transferred from the argon to the hydrogen, leading to generation of atomic hydrogen via dissociation of the hydrogen molecules. This transfer of energy from argon to hydrogen may be a more efficient mechanism for giving energy to hydrogen molecules than direct excitation of the hydrogen molecules by the radiation beam.

The amount of energy provided to the argon by the radiation beam is such that the argon is able to generate enough atomic hydrogen to provide a measurable increase in the amount of cleaning provided by the hydrogen (compared with the cleaning provided by the hydrogen in the absence of the argon). An electric field, or other means of accelerating the argon in order to generate the atomic hydrogen is not required.

The argon gas may be provided in one or more of the source SO, illumination system IL and projection system PS of the lithographic apparatus.

Argon is an example of a secondary gas which may be introduced into the lithographic apparatus along with hydrogen gas. The secondary gas may be any inert gas. Inert gases are preferred because non-inert secondary gases may give rise to unwanted contamination in the lithographic apparatus. For example, gases containing carbon, oxygen or nitrogen could give rise respectively to carbon contamination, oxidation of a mirror's ruthenium layer, and the formation of tin nitride.

The amount of secondary gas which is provided in the lithographic apparatus may be less than the amount of hydrogen gas. For example, the gas mixture may comprise at least 80% hydrogen, at least 90% hydrogen, at least 95% hydrogen or at least 99% hydrogen.

When selecting the amount of secondary gas to be present in the mixture, the following factors should be considered: a greater amount of secondary gas will provide a greater enhancement of the cleaning effect (by increasing the generation of hydrogen radicals), but may also lead to a greater degree of damage arising due to sputtering of secondary gas molecules on reflective surfaces of the lithographic apparatus. The degree to which sputtering may lead to damage of reflective surfaces may depend upon the mass of the molecules of the secondary gas. It may be possible for example to use a greater proportion of helium than of argon as the secondary gas without incurring significant damage of reflective surfaces due to sputtering.

The above description of embodiments of the invention refers to reflective surfaces of the lithographic apparatus. These may be considered to be examples of optical surfaces of the lithographic apparatus. It is not necessarily the case that all optical surfaces of the lithographic apparatus are reflective.

The term extreme ultraviolet (EUV) radiation as used above may be interpreted as meaning electromagnetic radiation having a wavelength of less than 20 nm, for example within the range of 10-20 nm, for example within the range of 13-14, for example within the range of 5-10 nm, for example such as 6.7 nm or 6.8 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The descriptions above are intended to be illustrative, not limiting. Thus, it will be apparent to one skilled in the art that modifications may be made to the invention as described without departing from the scope of the claims set out below.

The invention is not limited to application of the lithographic apparatus or use in the lithographic apparatus as described in the embodiments. Further, the drawings usually only include the elements and features that are necessary to understand the invention. Beyond that, the drawings of the lithographic apparatus are schematic and not on scale. The invention is not limited to those elements, shown in the schematic drawings (e.g. the number of mirrors drawn in the schematic drawings).

The person skilled in the art will understand that embodiments described above may be combined.

What is claimed is:

1. A lithographic apparatus comprising:
   a source configured to generate a radiation beam comprising desired radiation and undesired radiation using a plasma;
   an illumination system configured to condition the radiation beam and to receive hydrogen gas during operation of the lithographic apparatus;
   a support structure constructed to hold a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   one or more filters provided at an end of the projection system which receives the radiation beam last, the one or more filters being arranged to filter out ultraviolet radiation and/or deep ultraviolet radiation that assist in the generation of hydrogen radicals,
   wherein the lithographic apparatus is configured such that the radiation beam on entering the illumination system includes at least 50% of the undesired radiation that is generated by the plasma and includes wavelengths of radiation that interact with the hydrogen gas to generate hydrogen radicals configured to remove contamination from reflective surfaces within the lithographic apparatus.

2. The lithographic apparatus of claim 1, wherein the desired radiation comprises extreme ultraviolet radiation.

3. The lithographic apparatus of claim 1, wherein the projection system is configured to receive hydrogen gas during operation of the lithographic apparatus; and wherein the lithographic apparatus is configured such that the radiation beam on entering the projection system includes at least 50% of the undesired radiation that is generated by the plasma and includes wavelengths of radiation that interact with the hydrogen gas to generate hydrogen radicals.

4. The lithographic apparatus of claim 1, wherein the one or more filters are spectral purity filters.

5. A lithographic apparatus comprising:
   a source configured to generate a radiation beam using a plasma;
   an illumination system configured to condition the radiation beam;
   a support structure constructed to hold a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   one or more filters provided at an end of the projection system which receives the radiation beam last, the one or more filters being arranged to filter out ultraviolet radiation and/or deep ultraviolet radiation that assist in the generation of hydrogen radicals,
   wherein one or more of the source, illumination system and projection system is configured to receive hydrogen gas and an inert gas during operation of the lithographic apparatus, and wherein the radiation beam interacts with the inert gas to generate atomic hydrogen to increase an amount of cleaning of contamination on reflective surfaces within the lithographic apparatus provided by the hydrogen gas.

* * * * *